(12) United States Patent
Sandhage

(10) Patent No.: US 7,393,517 B2
(45) Date of Patent: *Jul. 1, 2008

(54) SHAPED MICROCOMPONENTS VIA REACTIVE CONVERSION OF SYNTHETIC MICROTEMPLATES

(75) Inventor: Kenneth H. Sandhage, Upper Arlington, OH (US)

(73) Assignee: The Ohio State University, Columbus, OH (US)

( * ) Notice: Subject to any disclaimer, the term of this patent is extended or adjusted under 35 U.S.C. 154(b) by 426 days.

This patent is subject to a terminal disclaimer.

(21) Appl. No.: 10/225,836

(22) Filed: Aug. 22, 2002

(65) Prior Publication Data

US 2003/0044515 A1  Mar. 6, 2003

Related U.S. Application Data

(60) Provisional application No. 60/314,533, filed on Aug. 23, 2001.

(51) Int. Cl.
*C01B 15/026* (2006.01)
(52) U.S. Cl. .................................................. 423/592.1
(58) Field of Classification Search ........................ None
See application file for complete search history.

(56) References Cited

U.S. PATENT DOCUMENTS

| | | | | | |
|---|---|---|---|---|---|
| 3,929,971 | A | * | 12/1975 | Roy | 423/308 |
| 4,039,726 | A | * | 8/1977 | Carr et al. | 428/700 |
| 5,214,011 | A | * | 5/1993 | Breslin | 501/127 |
| 5,651,900 | A | * | 7/1997 | Keller et al. | 216/56 |
| 5,770,076 | A | * | 6/1998 | Chu et al. | 210/490 |
| 5,798,042 | A | * | 8/1998 | Chu et al. | 210/490 |
| 5,893,974 | A | * | 4/1999 | Keller et al. | 210/483 |
| 5,948,255 | A | * | 9/1999 | Keller et al. | 210/321.84 |
| 5,985,164 | A | * | 11/1999 | Chu et al. | 216/41 |
| 5,985,328 | A | * | 11/1999 | Chu et al. | 424/489 |
| 6,044,981 | A | * | 4/2000 | Chu et al. | 210/490 |
| 6,107,102 | A | * | 8/2000 | Ferrari | 436/518 |

OTHER PUBLICATIONS

Kroger, N. et al., Species-Specific Polyamines From Diatoms Control Silica Morphology, Proc. Natl. Acad. Sci. USA, vol. 97, Issue 26, 14133-14138 (Dec. 2000).
Brott, L. et al., Ultrafast Holographic Nanopatterning of Biocatalytically Formed Silica, Nature 413, 291-293 (2001).
Lowenstam, H. et al., Mineralization by Organisms and the Evolution of Biomineralization, Biomineralization and Biological Metal Accumulation, 191-203 (1983).
Parkinson, J. et al., Beyond Micromachining: The Potential of Diatoms, Trends in Biotechnology 17 (5), 190-196 (1999).
Kroger, N. et al., Polycationic Peptides From Diatom Biosilica That Direct Silica Nanosphere Formation, Science, vol. 286, 1129-1132 (Nov. 1999).

* cited by examiner

*Primary Examiner*—Edward M Johnson
(74) *Attorney, Agent, or Firm*—Standley Law Group LLP

(57) ABSTRACT

The purpose of the present invention is to describe a novel approach for converting 3-dimensional, synthetic micro- and nano-templates into different materials with a retention of shape/dimensions and morphological features. The ultimate objective of this approach is to mass-produce micro- and nano-templates of tailored shapes through the use of synthetic or man-made micropreforms, and then chemical conversion of such templates by controlled chemical reactions into near net-shaped, micro- and nano-components of desired compositions. The basic idea of this invention is to obtain a synthetic microtemplate with a desired shape and with desired surface features, and then to convert the microtemplate into a different material through the use of chemical reactions.

20 Claims, No Drawings

SHAPED MICROCOMPONENTS VIA REACTIVE CONVERSION OF SYNTHETIC MICROTEMPLATES

This application claims the benefit of U.S. Provisional Patent Application No. 60/314,533, filed on Aug. 23, 2001, which is incorporated herein by reference.

TECHNICAL FIELD OF THE INVENTION

The present invention is in the field of shaped microcomponents or micropreforms fabricated via the reactive conversion of synthetic microtemplates. These synthetic microtemplates or micropreforms may then be converted into other oxides by a chemical reaction(s).

BACKGROUND OF THE INVENTION

The worldwide research and development effort on microdevices (e.g., electromechanical, hydromechanical, thermomechanical, electrochemical, thermoelectrical, etc.) has increased dramatically over the past decade. Such devices have found significant use as sensors in automotive and medical applications, with estimates of the global MEMS (microelectromechanical systems) market ranging from $12-14 billion in 2000. However, a far larger untapped potential exists for the use of new micromechanical devices in a variety of advanced applications, such as in: i) medicine (e.g., targeted drug or radiation delivery, rapid clinical and genomic analyses, in vitro sensors, microtools for surgery, micropumps and microvalves, microreactors, etc.), ii) transportation and energy production (e.g., new sensors and actuators for pollution control, enhanced energy utilization, and improved engine performance; microcomponents for automotive, diesel, jet, or rocket engines; microcomponents for turbines used in energy conversion or generation; microreactors, micropumps, microbearings, etc.), iii) communications and computing (e.g., micro-optical devices, microactuators, microswitches, microtransducers, etc.), and iv) the production/manufacturing of food, chemicals, and materials (e.g., microrobotics, rapid on-line microsensors, microreactors, micropumps, microdies, etc.).

Despite the recognized technological and economic significance of new microdevices, the fabrication methods used to date have been largely limited to techniques developed within the microelectronics industry. The micromachining of silicon may be done by one or a combination of methods, including but not limited to: photolithography (e.g. UV, x-ray, e-beam, ion-beam), dry physical etching (e.g. ion etching/sputtering, laser ablation), dry chemical etching (e.g. with a reactive gas), combined dry physical and chemical etching (e.g. reaction ion etching), wet chemical etching and LIGA. Furthermore, the properties of silicon (room temperature brittleness, poor creep resistance at □600° C., high thermal conductivity, modest melting point, biochemical incompatibility, etc.) make silicon-based microdevices unattractive for a number of potential applications. New fabrication methods capable of yielding self-assembled, non-silicon microdevices in a massively parallel fashion are needed to allow for a much wider range of commercial applications.

The purpose of the present invention is to provide a novel approach for converting 2- or 3-dimensional, synthetic (non-naturally-occurring) micro- and nano-templates into new materials with a retention of shape/dimensions and morphological features. The ultimate objective of this approach is to mass-produce micro- and nano-templates of tailored shapes through the use of synthetic or man-made micropreforms, and then chemical conversion of such templates by controlled chemical reactions into near net-shaped, micro- and nano-components of desired compositions.

SUMMARY OF THE INVENTION

The basic idea of this invention is to obtain a synthetic (non-naturally-occurring) microtemplate with a desired shape and/or with desired surface features, such as through micromachining of a material, and to convert the microtemplate into a different material with shape maintenance through the use of chemical reactions. For example, silicon may be micromachined to obtain a silicon micropreform. The silicon micropreform may then be oxidized (for example by heating in dry or wet oxygen or air) to obtain a silica microtemplate, or the silicon micropreform is used as a template or mold onto which silica or a silica precursor is deposited by any of the known deposition methods. The silica microtemplates may then be converted into a another oxide or oxide/metal composite through chemical reaction(s).

Another method of obtaining a microcomponent of the present invention is to micromachine silicon and then use the resulting silicon micropreform to obtain a shaped silicon-bearing ceramic precursor compound (e.g., SiC, Si3N4, MoSi2). The fabrication of a silicon-bearing ceramic precursor compound micropreform from a shaped silicon micropreform may be conducted by gas phase reaction of the shaped silicon micropreform (e.g., nitridation of the patterned silicon micropreform, carburization of the patterned silicon micropreform, reaction of patterned silicon with a Mo-bearing gas to form MoSi2), or by using the shaped or patterned silicon micropreform as a template or mold onto which a silicon-bearing compound or a silicon-bearing precursor compound may be deposited. Then the silicon-bearing precursor compound micropreforms may be converted into other oxides or oxide/metal composites through chemical reaction(s). The silicon-bearing ceramic precursor compounds may themselves be useful compounds or they may be converted to ceramics or intermetallic compounds.

The present invention is to a method for the production of shaped microcomponents comprising the steps of: obtaining at least one synthetic microtemplate having an original chemical composition and an original dimensional feature; and subjecting the at least one synthetic microtemplate to a chemical reaction, so as to partially or completely convert the microtemplate into a microcomponent having a chemical composition different than the original chemical composition and having substantially the same dimensional feature(s) as the original synthetic microtemplate.

The reacted or changed microtemplate may possess a composition, a shape, and surface features appropriate for a particular microcomponent or microdevice (e.g., microsprings, microball bearings, microsyringes, etc.). Other medical microdevices in which the present invention may be used are fully discussed in U.S. Pat. No. 6,107,102 to Ferrari, U.S. Pat. No. 6,044,981 to Chu et al., U.S. Pat. No. 5,985,328 to Chu et al., U.S. Pat. No. 5,985,164 to Chu et al., U.S. Pat. No. 5,948,255 to Keller et al., U.S. Pat. No. 5,893,974 to Keller et al., U.S. Pat. No. 5,798,042 to Chu et al., U.S. Pat. No. 5,770,076 to Chu et al., and U.S. Pat. No. 5,651,900 to Keller et al. The above-listed patents are hereby incorporated by reference. Hence, by this novel combined use of micromachining and reaction engineering, a large number of microcomponents of desired shape and of desired composition may be produced.

"Micromachining" of silicon may be done by one or a combination of methods, including but not limited to: photolithography (e.g. UV, x-ray, e-beam, ion-beam), dry physical etching (e.g. ion etching/sputtering, laser ablation), dry chemical etching (e.g. with a reactive gas), combined dry physical and chemical etching (e.g. reaction ion etching), wet chemical etching and LIGA.

"Deposition" is meant to include physical or chemical vapor deposition, spin coating of a silica slurry or silica precursor solution, screen printing of silica slurry or silica precursor solution, pressing of hot viscous glass onto the silicon micropreform, and casting of molten glass onto the silicon micropreform.

A "dimensional feature" is meant to include a shape or a surface feature. Surface features include, but are not limited to, pores, spacings between pores, depressions, ridges, and protuberances.

The terms "microtemplate", "micropreform" or "microarticle" are hereby used interchangeably and are deemed to have the same meaning. Zeolites are compounds that may be included in the definition of microporous or nanoporous preforms.

The term "patterned silicon" or "patterned silicon micropreform" means a silicon that has been formed into a specific shape or a micropreform that has been previously shaped.

A "microcomponent" is defined as an object that may have at least one size dimension that is less than 1 millimeter and is preferably less than 100 microns and most preferably less than 25 microns and/or at least one surface feature with a dimension that is less than 1 millimeter and is preferably less than 100 microns and most preferably less than 25 microns.

The chemical reaction used to partially or completely convert the synthetic microtemplate may be an additive reaction in which a reactant is chemically incorporated as a compound, solid solution, or mixture with the original constituents of the microtemplate. Such additive reactions are of the general type:

$$aA_bY_c + M_dX_e => aA_bY_c \cdot M_dX_e \quad (1)$$

where $A_bY_c$ is a reactant, $M_dX_e$ is a constituent of the microtemplate, and $aA_bY_c \cdot M_dX_e$ is the ionically or covalently bonded new solid compound, solid solution, or solid mixture obtained from this reaction that is retained in the microcomponent; and wherein a, b, c, d, and e are any stoichiometric variables. M is defined as any metal cation, X is defined as a metalloid ion. The reactant, $A_bY_c$, involved in this additive reaction may be present as a gas, a liquid or as a solid or within a gas phase, within a liquid phase or within a solid phase during the reaction. The reactant, $A_bY_c$, may also be deposited onto the microtemplate as a solid or liquid phase and then allowed to react, while in the solid or liquid state, with the microtemplate. An example of an additive reaction is:

$$nP_xO_y(g) + 3CaCo_3(s) => 3CaO \cdot nP_xO_y(s) + 3CO_2(g) \quad (2)$$

where $P_xO_y(g)$ is a gaseous phosphorous oxide reactant species, $CaCo_3(s)$ is a solid constituent of a microtemplate, and $3CaO \cdot nP_xO_y(s)$ is the solid product of this additive reaction that is retained in the microcomponent.

The chemical reaction used to partially or completely convert the synthetic microtemplate may be a metathetic (exchange) reaction of the following type:

$$aA_bX_w + M_cX_y \cdot N_dX_z => aA_bX_w \cdot N_dX_z + M_cX_y \quad (3)$$

in which "a" moles of reactant $A_bX_w$ react with one mole of $M_cX_y \cdot N_dX_z$ present within the microtemplate. In this metathetic reaction, the "a" moles of reactant $A_bX_w$ exchange with one mole of $M_cX_y$ in the compound $M_cX_y \cdot N_dX_z$ to form the ionically or covalently bonded products $aA_bX_w \cdot N_dX_z$ and $M_cX_y$. The product $aA_bX_w \cdot N_dX_z$ may be a solid compound, a solid solution, or a solid mixture. The reactant, $A_bX_w$, involved in this metathetic reaction may be present as or within a gas phase or a liquid phase during the reaction. The reactant, $A_bX_w$, may also be deposited onto the microtemplate as a solid or liquid phase and then allowed to react, while in the solid or liquid state, with the microtemplate. A, M and N are all defined as any metal cation. X is a metalloid ion. a, b, c, d, w, y and z are any stoichiometric variables.

The chemical reaction used to partially or completely convert the synthetic microtemplate may be an oxidation-reduction (redox) reaction of the following type:

$$yA + aM_xO_y => yAO_a + axM \quad (4)$$

in which "y" moles of elemental reactant A react with "a" moles of the oxide $M_xO_y$ present within the microtemplate. In this redox reaction, "y" moles of the reactant A become oxidized to form "y" moles of the product oxide, $AO_a$, and M within the oxide, $M_xO_y$, is reduced to form "ax" moles of M. A is defined as any elemental reactant but is preferably an element having a metallic characteristic. M is any metal. a, x and y are any stoichiometric variables. The elemental reactant, A, involved in this oxidation-reduction reaction may be present as or within a gas phase or a liquid phase during the reaction. The elemental reactant, A, may also be deposited onto the microtemplate as a solid or liquid phase and then allowed to react, while in the solid or liquid state, with the microtemplate. A redox reaction may be used to exchange the silicon in silicon oxide (silica) with a displacing reactant species, so as to convert the silicon oxide into a different metal oxide compound. An example of such a redox reaction is:

$$2Mg(g) + SiO_2 => 2MgO(s) + Si(s) \quad (5)$$

where Mg(g) is a gaseous displacing reactant species, $SiO_2(s)$ (silica) is a solid oxide constituent of a microtemplate, and MgO(s) is the solid oxide product of this redox reaction that is retained in the microcomponent. In this example, Mg(g) is the displacing reactant species that is oxidized to form MgO and $SiO_2(s)$ is reduced to form Si(s). In this example, the displacing reactant species may be any reactant species adapted to reduce the silicon oxide into silicon. For instance, the said displacing reactant species may be selected from the group consisting of alkaline earth elements, such as beryllium, magnesium, calcium, strontium, barium, and mixtures thereof. The said displacing reactant species may also be selected from the group consisting of alkali elements such as hydrogen, lithium, and mixtures thereof. The said displacing reactant species may also be selected from the group consisting of aluminum, titanium, zirconium, hafnium, yttrium, lanthanum, cerium, praseodymium, neodymium, samarium, europium, gadolinium, terbium, dysprosium, holmium, erbium, thulium, ytterbium, lutetium, thorium, uranium, and mixtures thereof.

The microcomponent may define a space wherein the space is provided with at least one additional non-native substance. The at least one additional non-native substance may be a pharmaceutically active substance. The non-native substance may have an avenue of escape from the defined microcomponent space, whether by exiting through micropores or by osmosis.

The present invention is also to a method for the production of a shaped microcomponent comprising the steps of: obtaining at least one synthetic microtemplate having an original chemical composition, and an original dimensional feature; and subjecting the at least one synthetic microtemplate to a first chemical reaction, so as to partially or completely convert the at least one synthetic microtemplate into an intermediate microcomponent having a second chemical composition different than the original chemical composition; and then subjecting the intermediate microcomponent to a second chemical reaction so as to partially or completely convert the intermediate microcomponent into the shaped microcomponent having a chemical composition different than the original chemical composition and different than the second chemical composition and having substantially the same dimensional feature as the original dimensional feature.

Among the reactions that may be used to convert silica-based microtemplates into other oxides or oxide/metal composites are solid/fluid displacement (oxidation-reduction) reactions of the following type:

$$SiO_2(s)+2/yM(g)=>2/yMO_y(s)+(Si) \quad (6)$$

$$SiO_2(s)+2/yM(l)=>2/yMO_y(s)+(Si) \quad (7)$$

where (Si) refers to silicon present as a pure solid, liquid, or gas or to silicon dissolved in a solid, liquid, or gas solution. For example, prior work has shown that silica ($SiO_2(s)$) may be converted into $Al_2O_3$/Al—Si composites that retain the shape/dimensions within 1% by the following net reaction:

$$3SiO_2(s)+4Al(l)=>2Al_2O_3(s)+3(Si) \quad (8)$$

where (Si) refers to an Al—Si alloy. Exposing silica microtemplates to Al-rich liquid alloys may produce such composites. The silica may be converted into a dense mixture of $Al_2O_3(s)$ and Al—Si alloy with little ($\square$1%) change in dimensions or shape. That is, although 2 moles of $Al_2O_3(s)$ possess a smaller volume than 3 moles of $SiO_2(s)$, the difference in these volumes is taken up by the liquid Al—Si (and, hence, solid Al—Si upon solidification of this liquid). After such reaction, the excess solidified Al—Si within the transformed silica microtemplate may be removed by selective etching/dissolution to yield an $Al_2O_3(s)$ body that retains the shape and/or surface features of the starting silica microtemplate.

Displacement (oxidation-reduction) reactions of the following type may also be used to convert silica-based microtemplates into other oxides or oxide/metal composites:

$$2Ca(l)+SiO_2(s)=>2CaO(s)+(Si) \quad (9)$$

$$2Sr(l)+SiO_2(s)=>2SrO(s)+(Si) \quad (10)$$

$$2Ba(l)+SiO_2(s)=>2BaO(s)+(Si) \quad (11)$$

For these reactions, the oxide produced has a larger volume than the oxide consumed (e.g., 2 moles of CaO(s) have a larger volume than 1 mole of $SiO_2(s)$). In these cases, although the overall silica microtemplate shape may be retained upon reaction, some surface features may be controllably altered (e.g., some of the fine pores of the silica microtemplate may be filled in with new ceramic). Alternately, depending on the reaction conditions, the silica microtemplate may expand upon reaction to yield a larger component with the same shape and with surface features of the same size. If the (Si) product of reactions (9)-(11) is present as a solid phase, then such silicon may be removed from the converted microcomponent (e.g., by selective dissolution), so as to yield microcomponents comprised of only oxides. Pure CaO bodies may be particularly attractive for biomedical applications, given the biocompatibility of CaO in the human body (i.e., CaO may dissolve in blood and be used to enhance natural bone growth).

In addition to forming single component oxides, reactions may be chosen that yield multicomponent oxides. For example, $$Mg_1Al_2(l)+2SiO_2(s)=>MgAl_2O_4(s)+2(Si) \quad (12)$$

Spinel, $MgAl_2O_4$, is a relatively high melting, refractory oxide with good resistance to chemical attack by basic or acidic oxide liquids or by reactive gases (e.g., sodium vapor).

Reactions may also be chosen that yield multicomponent metal products, such as silicides:

$$X_{4/y}Mo(l)+2SiO_2(s)=>4/yXO_y(s)+MoSi_2(s) \quad (13)$$

where X refers to an element capable of undergoing a displacement reaction with $SiO_2(s)$. $MoSi_2(s)$ is a relatively high melting and oxidation-resistant intermetallic compound.

Oxidation-reduction reactions with silica microtemplates may also involve gas-phase reactants, such as shown below:

$$2Mg(g)+SiO_2(s)=>2MgO(s)+(Si) \quad (14)$$

$$2Ca(g)+SiO_2(s)=>2CaO(s)+(Si) \quad (15)$$

By using such gas/solid reactions to transform $SiO_2(s)$, excess solid metallic reactant (e.g., excess Mg or Ca) adhering to the converted body may be avoided, unlike for the case of liquid/solid oxidation-reduction reactions. For oxidation-reduction reactions involving a liquid metallic reactant, excess solidified metallic reactant adhering to and surrounding the converted oxide component must be removed upon cooling in order to extract the microcomponent. This removal of excess metal is an additional time-consuming step that may be avoided by using gas/solid oxidation-reduction reactions. Hence, such gas/solid oxidation-reduction reactions have an inherent advantage over liquid/solid oxidation-reduction reactions.

If the (Si) product of reactions (14) and (15) is present as a solid phase (either pure solid silicon or a silicon-bearing solid), then such silicon may be removed from the converted microcomponent (e.g., by selective dissolution), so as to yield microcomponents comprised of only oxides. Alternately, a condensed (Si) product phase may be oxidized by reaction with gaseous oxygen to convert the silicon back into $SiO_2(s)$. Subsequent oxide-oxide reactions may then be used to produce microcomponents comprised of multioxide compounds. For example, reoxidation of a solid (Si) product in reaction (14) to $SiO_2(s)$ followed by the following oxide-oxide reaction may yield a microcomponent comprised of forsterite, $Mg_2SiO_4(s)$:

$$2MgO(s)+SiO_2(s)=>Mg_2SiO_4(s) \quad (16)$$

Oxidation-reduction reactions may also be used to partially consume the silica in the microtemplates, so that subsequent oxide-oxide reactions may be used to produce microcomponents comprised of multioxide compounds. Consider, for example, the following reactions:

$$2Mg(g)+2SiO_2(s)=>2MgO(s)+SiO_2(s)+(Si) \quad (17)$$

$$3Ca(g)+5/2SiO_2(s)=>3CaO(s)+SiO_2(s)+3/2(Si) \quad (18)$$

In these reactions, the silica is only partially consumed (i.e., only 1 of 2 moles of silica is reduced by the Mg(g) or Ca(g)). Further heat treatment of the oxide products of reactions (17) and (18) in the absence of gaseous Mg or Ca may result in the formation of the refractory compounds, $Mg_2SiO_4$ and $Ca_3SiO_5$, by the following oxide-oxide reactions:

$$2MgO(s)+SiO_2(s)=>Mg_2SiO_4(s) \quad (19)$$

$$3CaO(s)+SiO_2(s)=>Ca_3SiO_5(s) \quad (20)$$

Oxidation-reduction reactions with silica microtemplates may also be used to produce microcomponents comprised of oxide/intermetallic composites, such as shown below:

$$2Mg(g) + SiO_2(s) \Rightarrow 2MgO(s) + Mg_2Si(s) \quad (21)$$

$$2Ca(g) + SiO_2(s) \Rightarrow 2CaO(s) + Ca_2Si(s) \quad (22)$$

A series of reactions may also be used to convert silica microtemplates into multicomponent ceramics. For example, silica microtemplates may first be converted into CaO by one of the following oxidation-reduction reactions:

$$2Ca(l) + SiO_2(s) \Rightarrow 2CaO(s) + (Si) \quad (23)$$

$$2Ca(g) + SiO_2(s) \Rightarrow 2CaO(s) + (Si) \quad (24)$$

After selective removal of the (Si) product (e.g., by selective dissolution), the resulting, shaped CaO microbodies may then undergo further reaction(s) to produce shaped microbodies comprised of CaO-bearing compounds. For example, the following types of additive reactions may be used to convert the CaO into calcium phosphates:

$$mCaO(s) + nP_xO_y(g) \Rightarrow mCaO \cdot nP_xO_y(s) \quad (25)$$

$$mCaO(s) + nP_xO_y(g) + pH_2O(g) \Rightarrow mCaO \cdot nP_xO_y \cdot pH_2O(s) \quad (26)$$

where $P_xO_y(g)$ refers to a gaseous P—O-bearing species, $mCaO \cdot nP_xO_y(s)$ refers to a calcium phosphate compound (e.g., $Ca_2P_2O_7$, $Ca_3P_2O_8$), and $mCaO \cdot nP_xO_y \cdot pH_2O(s)$ refers to hydrated calcium phosphate compounds (e.g., calcium hydroxyapatite, $10CaO \cdot 6P_xO_y \cdot 2H_2O$). Calcium phosphate microcomponents may be particularly attractive for biomedical applications. For example, because calcium hydroxyapatite is the major mineral in human teeth and bones, the body does not reject this compound. Hence calcium hydroxyapatite microcomponents derived from silica microtemplates would be biocompatible. Such biocompatible microcomponents would be particularly attractive for biomedical applications (e.g., bioresorbable microcapsules for targeted drug or radiation delivery).

The chemical compositions of calcium carbonate microtemplates may be changed by additive reactions. Such additive reactions may involve gas-phase reactants, as shown below (and mentioned above):

$$nP_xO_y(g) + 3CaCO_3(s) \Rightarrow 3CaO \cdot nP_xO_y(s) + 3CO_2(g) \quad (2)$$

Alternately, condensed phase reactants may be deposited onto the calcium carbonate microtemplate by a vapor phase technique (including, but not limited to, sputtering, laser ablation, evaporation, and chemical vapor deposition) or a liquid phase technique (including, but not limited to, melt infiltration, solution infiltration, slurry infiltration). After deposition of the reactants, the calcium carbonate may then undergo an additive reaction with the reactant. Examples of additive reactions between condensed phase reactants and calcium carbonate include, but are not limited to:

$$6Al_2O_3(s) + CaCO_3(s) \Rightarrow CaAl_{12}O_{19}(s) + CO_2(g) \quad (27)$$

$$SiO_2(s) + 3CaCO_3(s) \Rightarrow Ca_3SiO_5(s) + 3CO_2(g) \quad (28)$$

$$TiO_2(s) + CaCO_3(s) \Rightarrow CaTiO_3(s) + CO_2(g) \quad (29)$$

$$ZrO_2(s) + CaCO_3(s) \Rightarrow CaZrO_3(s) + CO_2(g) \quad (30)$$

Metallic precursors to oxide reactants may also deposited onto the calcium carbonate microtemplate by a vapor phase technique or a liquid phase technique, and then oxidized to form an oxide reactant. The oxide reactant may then undergo reaction with the calcium carbonate to form a new compound, solid solution, or mixture. Examples of metallic precursors that may be deposited, oxidized, and then reacted with calcium carbonate include, but are not limited to phosphorus, aluminum, silicon, titanium, and zirconium (i.e., oxidation of these deposited elements may be followed by reactions with calcium carbonate as per reactions (2) and (27)-(30)).

Additive reactions of the type (2) and (27)-(30) may also be used to convert silica microtemplates into silicate compounds. Examples of such additive reactions include, but are not limited to:

$$3Al_2O_3(s) + 2SiO_2(s) \Rightarrow Al_6Si_2O_{13}(s) \quad (31)$$

$$3CaO(s) + SiO_2(s) \Rightarrow Ca_3SiO_5(s) \quad (32)$$

$$2MgO(s) + SiO_2(s) \Rightarrow Mg_2SiO_4(s) \quad (33)$$

$$ZrO_2(s) + SiO_2(s) \Rightarrow ZrSiO_4(s) \quad (34)$$

Metallic precursors to oxide reactants may also deposited onto the silica microtemplate by a vapor phase technique or a liquid phase technique, and then oxidized to form an oxide reactant. The oxide reactant may then undergo reaction with the silica to form a new compound, solid solution, or mixture. Examples of metallic precursors that may be deposited, oxidized, and then reacted with silica include, but are not limited to aluminum, calcium, magnesium, and zirconium (i.e., oxidation of these deposited elements may be followed by reactions with silica as per reactions (31)-(34)).

DETAILED DESCRIPTION OF THE EXEMPLARY EMBODIMENT(S)

Embodiment 1—Machining/forming Plus Chemical Conversion of Shape to Silica then to Desired Ceramic-bearing Microcomponent Silicon is micromachined by one or a combination of micromachining methods listed above. The silicon micropreform is then used to obtain a patterned silica micropreform. The fabrication of a silica micropreform from a patterned silicon micropreform is conducted by oxidation of the patterned silicon micropreform. The silica micropreform is then used in one or more subsequent chemical reaction(s) or series of reactions to form a ceramic microcomponent that has maintained the shape of the original patterned silicon micropreform while changing the composition of the micropreform.

Embodiment 2—Machining/forming Plus Coating and Chemical Conversion of Coating to Silica then to Desired Ceramic-bearing Component Silicon is micromachined by one or a combination of micromachined methods listed above to yield a silicon micropreform. The silicon micropreform is then used as a template or mold onto which silica or a silica precursor is deposited by any of the deposition methods listed above. The silica or silica precursor is then reacted to convert them into another oxide or oxide/metal composite while maintaining the shape of the original silicon micropreform.

Embodiment 3—Machining/forming Plus Conversion of Shape to Silicon-bearing Ceramic Precursor Compounds then Conversion to other Carbides, Nitrides, Silicides and/or to other Ceramics and/or to other Intermetallic Compounds Silicon is micromachined by one or a combination of the methods listed above to yield a patterned silicon micropreform. The silicon micropreform is then subjected to a gas phase reaction to yield a silicon-bearing ceramic precursor compound. The silicon-bearing ceramic precursor compounds are any known silicon based compounds including but not limited to $MoSi_2$. The gas phase reactions are for example, nitridation of the patterned silicon micropreform, carburization of the patterned silicon micropreform, or reaction of the patterned silicon with a Mo-bearing gas to form $MoSi_2$. The silicon-bearing ceramic precursor compounds are themselves useful compounds or may be converted to other compounds, ceramic compounds or intermetallic compounds.

Embodiment 4—Machining/forming Plus Coating of Silicon-bearing Ceramic Precursor Compounds and then Conversion to other Carbides, Nitrides, Silicides and/or to other Ceramics and/or to other Intermetallic Compounds Silicon is micromachined by one or a combination of the methods listed above to yield a patterned silicon micropreform. The silicon micropreform is then used as a template or mold onto which a different silicon compound (e.g. SiC, $Si_3N_4$ or $MoSi_2$) or a silicon compound precursor may be deposited by any of the deposition methods listed above. A chemical reaction then converts deposited materials into other compounds, ceramic compounds or intermetallic compounds.

Embodiment 5

Like Embodiment 3 except that carbide, nitride or silicide is further converted to a second carbide nitride or silicide, and/or to other second ceramics and/or to other intermetallic compounds.

Embodiment 6

Like Embodiment 4 except that carbide, nitride or silicide is further converted to a second carbide, nitride or silicide, and/or to other second ceramics and/or to other intermetallic compounds.

The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, it will be within the ability of one of ordinary skill in the art to make alterations or modifications to the present invention, such as through the substitution of equivalent chemicals or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof. The claims are hereby incorporated by references into the specification.

What is claimed is:

1. A method for the production of a shaped microcomponent comprising the steps of:
   obtaining at least one non-naturally occurring microtemplate having an original chemical composition and an original dimensional feature, wherein said original chemical composition comprises a species selected from the group consisting of silica and silicon;
   oxidizing each said at least one microtemplate so as to convert into silica, if necessary, any silicon therein; and
   subjecting each said at least one microtemplate to a chemical reaction, so as to partially or completely convert each said at least one microtemplate into said shaped microcomponent having a chemical composition different than said original chemical composition and having substantially the same dimensional feature as said original dimensional feature, wherein said chemical reaction is a metathetic reaction of the following type:

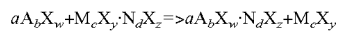

where $A_bX_w$ is a reactant, $M_cX_y \cdot N_dX_z$ is a constituent of the said at least one microtemplate, $aA_bX_w \cdot N_dX_z$ is an ionically or covalently bonded first solid reaction product that is retained in the said shaped microcomponent, and $M_cX_y$ is a second reaction product; wherein a, b, c, d, w, y and z are stoichiometric variables having positive integer values; wherein A, M, and N are any metal cation; and wherein X is a metalloid ion or a displacing reactant species thereof.

2. The method of claim 1, wherein said shaped microcomponent defines a cavity wherein said cavity is provided with at least one additional non-native substance.

3. The method of claim 2, wherein said at least one additional non-native substance is a pharmaceutically acceptable substance.

4. The method of claim 1, comprising the further step of:
   Converting the silica in each said at least one microtemplate into another oxide before subjecting each microtemplate to the metathetic reaction.

5. The method of claim 4 wherein $M_cX_y \cdot N_dX_z$ is selected from the group consisting of oxide compounds, oxide solid solutions, and oxide mixtures.

6. The method of claim 1 wherein $M_cX_y \cdot N_dX_z$ is selected from the group consisting of silicon oxide-bearing compounds, silicon oxide-bearing solid solutions, and silicon oxide-bearing mixtures.

7. The method of claim 6 wherein said silicon oxide-bearing compound is selected from the group consisting of aluminosilicates, alkali silicates, alkaline earth silicates, alkali aluminosilicates, alkaline earth aluminosilicates, borosilicates, cadmium silicates, cobalt silicates, erbium silicates, iron silicates, lead silicates, manganese silicates, neodymium silicates, nickel silicates, yttrium silicates, ytterbium silicates, zinc silicates, zircon, and mixtures thereof.

8. The method of claim 5 wherein $M_cX_y \cdot N_dX_z$ is selected from the group consisting of metal oxide-bearing compounds, metal oxide-bearing solutions, and metal oxide-bearing mixtures.

9. The method of claim 8 wherein $M_cX_y \cdot N_dX_z$ is selected from the group consisting of calcium oxide-bearing compounds, calcium oxide-bearing solutions, and calcium oxide-bearing mixtures.

10. The method of claim 9 wherein said calcium oxide-bearing compound is selected from the group consisting of calcium alkalisilicates, calcium aluminates, calcium aluminosilicates, calcium alkalialuminosilicates, calcium bismuthates, calcium borates, calcium cerates, calcium chromites, calcium cuprates, calcium ferrites, calcium gadolinium oxides, calcium gallates, calcium germanates, calcium hafnate, calcium manganates, calcium molybdates, calcium niobates, calcium phosphates, calcium plumbates, calcium silicates, calcium stannates, calcium sulfates, calcium tantalates, calcium titanates, calcium tungstates, calcium uranium oxides, calcium vanadates, calcium yttrium oxides, calcium zirconates, and mixtures thereof.

11. The method of claim 1 wherein said shaped microcomponent possesses a shape selected from the group consisting of a solid microcylinder, a microtube, a solid microbar, a hollow microbar, a solid microsphere, a hollow microsphere, a microwheel, a microgear, a microrotor, a microplate, a microdisk, a microtetrahedron, a microwedge, a microtetrakaidecahedron, a microspring, a microspiral, a microlever, a microcantilever, a solid microcone, a microfunnel, a microhoneycomb, and a micromesh.

12. The method of claim 1 wherein said shaped microcomponent is used in a device selected from the group consisting of a micropump, a microvalve, a microfunnel, a micronozzle, a microreactor, a microbearing, a micropulley, a microturbine engine, a micropiston engine, a micromotor, a microactuator, a microswitch, a microtransducer, a microhinge, a microrelay, a microdie, a microsensor, a microcatalyst, a microsyringe, a microneedle, a microcapsule, a microsieve, a microfilter, a micromembrane, a microseparator, a micromirror, a microlens, a microprism, a microdiffraction grating, and a microrefraction grating.

13. The method of claim 1 wherein said shaped microcomponent possesses at least one dimensional feature that is less than 1 millimeter in size.

14. The method of claim 1 wherein said shaped microcomponent possesses at least one dimensional feature that is less than 100 microns in size.

15. The method of claim 1 wherein said shaped microcomponent possesses at least one dimensional feature that is less than 25 microns in size.

16. The method of claim 1 wherein said shaped microcomponent possesses at least one dimensional feature that is less than 10 microns in size.

17. The method of claim 1 wherein said shaped microcomponent possesses at least one dimensional feature that is less than 1 micron in size.

18. The method of claim 1 wherein said shaped microcomponent possesses at least one dimensional feature that is less than 100 nanometers in size.

19. The method of claim 1 wherein said shaped microcomponent possesses at least one dimensional feature that is less than 25 nanometers in size.

20. The method of claim 1 wherein said shaped microcomponent possesses at least one dimensional feature that is less than 10 nanometers in size.

* * * * *